United States Patent
Jonczyk

(10) Patent No.: US 8,062,704 B2
(45) Date of Patent: Nov. 22, 2011

(54) SILICON RELEASE COATING, METHOD OF MAKING SAME, AND METHOD OF USING SAME

(75) Inventor: Ralf Jonczyk, Wilmington, DE (US)

(73) Assignee: Motech Americas, LLC, Newark, DE (US)

( * ) Notice: Subject to any disclaimer, the term of this patent is extended or adjusted under 35 U.S.C. 154(b) by 1146 days.

(21) Appl. No.: 11/832,871

(22) Filed: Aug. 2, 2007

(65) Prior Publication Data

US 2009/0031535 A1   Feb. 5, 2009

(51) Int. Cl.
*B05D 7/22* (2006.01)
*B05D 3/02* (2006.01)
*F27B 14/10* (2006.01)

(52) U.S. Cl. .................................. 427/230; 427/374.1

(58) Field of Classification Search .......... 427/230–239, 427/374.1; 432/248
See application file for complete search history.

(56) References Cited

U.S. PATENT DOCUMENTS

| | | | |
|---|---|---|---|
| 4,218,418 A | | 8/1980 | Schmid et al. |
| 5,431,869 A | * | 7/1995 | Kumar et al. .................. 264/85 |
| 6,491,971 B2 | * | 12/2002 | Costantini et al. ............ 427/133 |
| 2005/0176218 A1 | | 8/2005 | Jonczyk et al. |
| 2007/0034251 A1 | | 2/2007 | Jonczyk et al. |
| 2009/0249999 A1 | * | 10/2009 | Roligheten et al. ........... 117/223 |

FOREIGN PATENT DOCUMENTS

| | | |
|---|---|---|
| EP | 1739209 | 1/2007 |
| WO | 2004053207 | 6/2004 |
| WO | WO 2004/053207 A1 * | 6/2004 |

OTHER PUBLICATIONS

Ramachandra Rao et al., "Nitride-bonded silicon nitride from slip-cast Si + Si3N4 compacts", Journal of Materials Research, Materials Research Society, Feb. 1, 2002, pp. 386-395, vol. 17, No. 2.
European Search Report (EP 2025780) completed Feb. 23, 2010.

* cited by examiner

*Primary Examiner* — William Phillip Fletcher, III
(74) *Attorney, Agent, or Firm* — Saul Ewing, LLP

(57) ABSTRACT

A method of making a release coating includes the following steps: forming a mixture that includes (a) solid components comprising (i) 20-99% silicon by weight and (ii) 1-80% silicon nitride by weight and (b) a solvent; applying the mixture to an inner portion of a crucible or graphite board adapted to form an ingot or wafer comprising silicon; and annealing the mixture in a nitrogen atmosphere at a temperature ranging from 1000 to 2000° C. The invention may also relate to release coatings and methods of making a silicon ingot or wafer including the use of a release coating.

9 Claims, 1 Drawing Sheet

SILICON RELEASE COATING, METHOD OF MAKING SAME, AND METHOD OF USING SAME

GOVERNMENT RIGHTS STATEMENT

This invention was made with Government support under the Department of Energy Contract No. DE-AC36-99GO10337. Subcontract ZAX-5-33628-06. The Government has certain rights to the invention.

BACKGROUND OF THE INVENTION

The present invention may relate to a release coating comprising a mixture of silicon nitride and silicon powder. In certain embodiments, the release coating may inhibit or prevent the formation of a silicon carbide (SiC) alloy that can act as a bond or adhering agent between a silicon part and a graphite part.

Graphite has many properties that may make it a useful material on which to grow silicon parts. But in some instances, silicon can bond to the graphite, forming a SiC alloy.

The semiconductor industry may use quartz crucibles to line graphite parts. In some instances, this works well, such as where the interface between the quartz and the silicon may be discarded. Where silicon parts need to be released—for example, in ingot casting or other wafer casting processes—mixtures of $Si_3N_4$ or $SiO_2$ may be used as release coatings. See U.S. Pat. No. 4,218,418.

BRIEF DESCRIPTION OF THE INVENTION

In an embodiment, there is a method of making a release coating including the following steps. First, a mixture is formed that includes (a) solid components comprising (i) 20-99% silicon by weight and (ii) 1-80% silicon nitride by weight and (b) a solvent. Second, the mixture is applied to an inner portion of a crucible or graphite board adapted to form an ingot or wafer comprising silicon. And third, the applied mixture is annealed in a nitrogen atmosphere at a temperature ranging from 1000 to 2000° C.

In another embodiment, there is a method of making an ingot or wafer comprising silicon. The method includes the following steps. First, a mixture is formed that includes (a) solid components comprising (i) 30-90% silicon by weight and (ii) 10-70% silicon nitride by weight and (b) water. Second, the mixture is applied to a crucible or graphite board adapted to form the ingot or wafer comprising silicon. Third, the applied mixture is annealed in a nitrogen atmosphere at a temperature ranging from 1300 to 1500° C. Fourth, silicon is poured into the crucible or graphite board and melted. Fifth, the crucible or graphite board is cooled until the silicon solidifies. And sixth, the ingot or wafer is removed from the crucible or graphite board.

In another embodiment, there is a colloidal mixture for preparing a release coating. The colloidal mixture consists essentially of: (a) a solid component comprising (i) 30-90% silicon by weight and (ii) 10-70% silicon nitride by weight; and (b) a liquid component comprising water. The colloidal mixture has a liquids-to-solids weight ratio of the solid component to liquid component of 3:1 to 10:1.

DETAILED DESCRIPTION OF THE INVENTION

Figure 1:
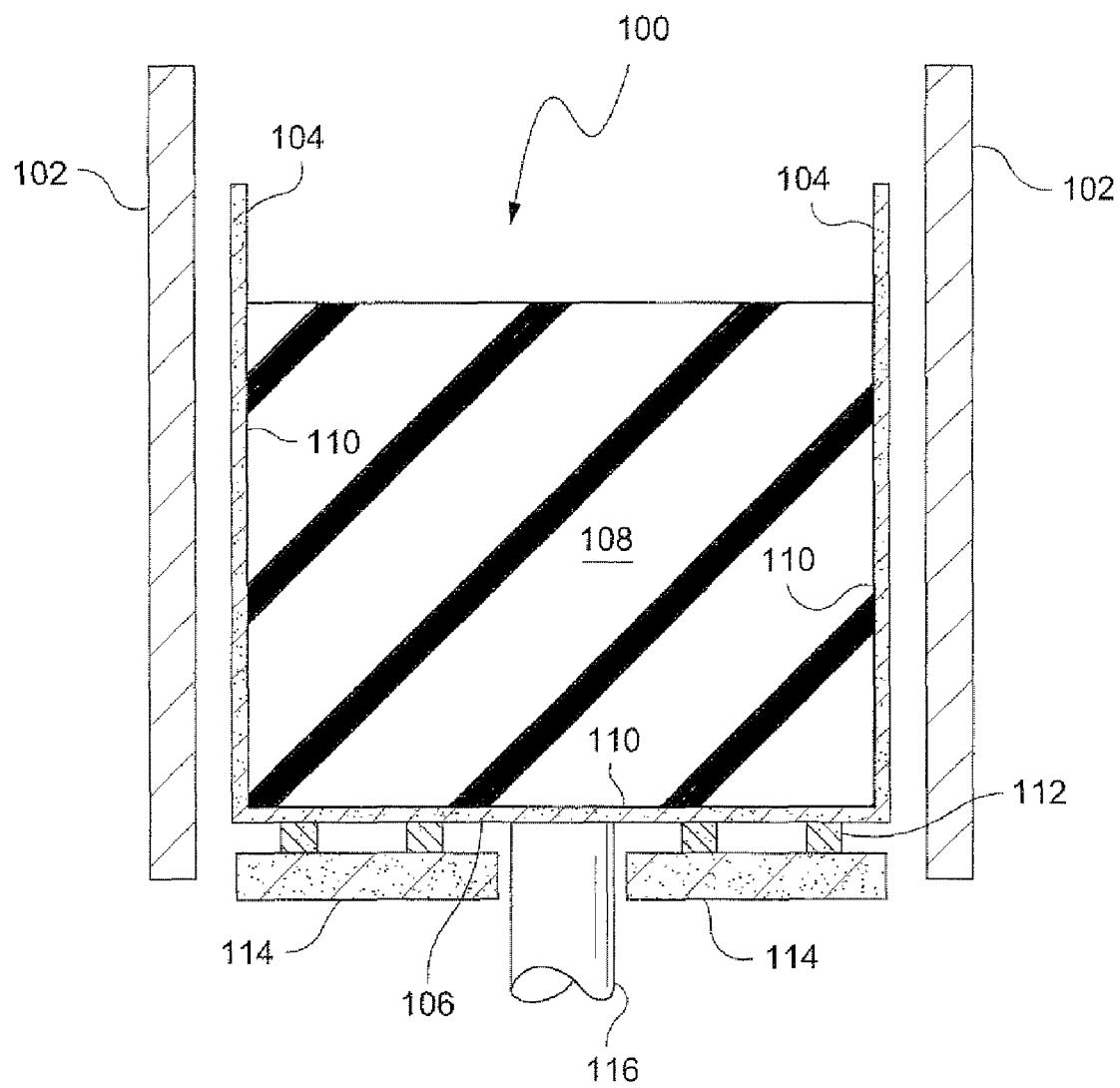
FIG. 1 partially illustrates a crucible within the heating chamber of a casting furnace, in accordance with an exemplary embodiment of the present invention.

At least in certain exemplary embodiments, the present invention may prevent or inhibit a bond from forming between silicon and carbon, may introduce little to no impurities, and may be relatively inexpensive. In certain exemplary embodiments, the present invention may be used in the manufacture of silicon wafers for use in solar energy-related applications, including, but not limited to, photovoltaic modules. See U.S. Patent App. Pub. Nos. 2005/0176218 and 2007/0034251. The silicon wafer may be doped with one or more n-type or p-type dopants, including, for example, elements in group III and/or group V of the Periodic Table. Suitable dopants may include, for example, boron, arsenic, phosphorus and gallium.

As used herein, "silicon" means pure silicon and silicon comprising dopants or other impurities. Furthermore, as used herein, "silicon ingot" shall include silicon wafers or any other suitable shape or form of solidified silicon.

Crucibles and casting furnaces are well known in the art of manufacturing silicon wafers, and any suitable combination of configuration and operational parameters may be used in connection with at least certain embodiments of the present invention. FIG. 1, for example, illustrates a crucible 100 within the cylindrical heating chamber defined by the heaters 102 of a casting furnace. The crucible 100 is defined, in part, by a disc 106 (e.g., a molybdenum or graphite disc) which itself is supported by rods 112 (e.g., graphite rods) mounted on a support plate 114 (e.g., a graphite support plate) on the bottom of the heating chamber. A heat exchanger 116 (e.g., a helium cooled molybdenum heat exchanger), extends through openings in the center of the plate 114 and engages the center of disc 106. Although FIG. 1 is not drawn to scale, crucible 100 may be about 6 inches in height and diameter and its cylindrical wall 104 and base 24 may be about 0.15 inches thick.

FIG. 1 illustrates that the crucible 100 contains a cylindrical wall 104 (e.g., a graphite wall). The shape of silicon ingot 108 is influenced by the particular shape of the wall 104 and disc 106. As illustrated in FIG. 1, there is a boundary layer 110 comprising a release agent between silicon wafer and the wall 104 and disc 106. The boundary layer 110 need not be coterminous with the height of the silicon ingot. In the embodiment of FIG. 1, for instance, boundary layer 110 extends further up walls 104 than silicon ingot 108. Furthermore, the boundary layer need not have a uniform or substantially uniform thickness and need not coat all or substantially all portions of walls 104 and/or disc 106.

The silicon—whether pure or impure (e.g., containing dopants, impurities, etc.)—may be melted in the crucible, then solidified to form the ingot 108. Alternatively, the silicon may be at least partially melted when poured into the crucible 100, then solidified. The solidification process may include the use of a "seed." After the silicon is at least partially or mostly solidified, the temperature of the crucible wall 104 will be decreased, e.g., below the silicon melting temperature, and the crucible 100 and solidified ingot 108 will then be cooled.

In an embodiment described herein, the boundary layer 110 comprising a release agent may inhibit or prevent the formation of a bond between the silicon ingot 108 and the contacting portions of the crucible walls 104. In an embodiment, the release agent comprises a mixture of silicon nitride, silicon, and solvent (e.g., water). Preferably, this mixture may be approximately homogenous after mixing. This mixture, which may comprise a colloidal suspension, is sprayed on or applied to at least some of the graphite part(s) of the crucible, then preferably annealed at a temperature in the range of 1000 to 2000° C. (more preferably 1300 to 1500° C.) in a nitrogen atmosphere. In a preferred embodiment, the suspension is applied to substantially all of the graphite that would contact silicon. In some embodiments, the nitrogen atmosphere may also comprise other gases, preferably inert gases such as argon, etc.

In another embodiment, the release coating may be used in connection with a wafer casting process involving a graphite board having a machined mold. In an embodiment, for example, there may be a graphite board measuring 115 cm long, 30 cm wide, and 0.5 cm thick. The graphite board may be machined to have 7 molds on each side. The molds may be, for example, 0.1 cm deep and 16 cm$^2$. The board may be first coated with a release coating as described herein, then silicon powder may be poured into the molds on the board. The board with the silicon may be pushed through the furnace with a temperature profile such that the silicon first melts and then crystallizes.

One suitable temperature profile according to an exemplary embodiment, for example, may be as follows. The peak temperature set point is about 1500° C. The melting process may take about 3 to 5 min from room temperature to 1415° C., and the crystallization process may take about 1 to 2 min to about 1400° C. The silicon may not exceed the melting point of silicon, which is 1415° C. The process of melting silicon (i.e., changing from solid to liquid) requires a large amount of energy (e.g., changing the temperature from 1414° C. to 1415° C. requires the same amount of energy as heating the solid silicon from room temperature to 1414° C.). This may cause the temperature to be stable at the melting point until all silicon has melted. In a preferred embodiment, all of the silicon is not melted, and thus the temperature of the silicon may not exceeds 1415° C. Once the wafer is formed, it cools down from 1400° C. to about 200° C. in about 10 min.

After the silicon wafers are removed, the board may be rotated so that the process may take place on the opposite side of the board—i.e., so that another batch of silicon may be melted and formed into silicon wafers. This process may be repeated numerous times (e.g., for several hours) until a new layer of the release coating needs to be applied.

The boundary layer may inhibit or prevent molten silicon metal from forming a silicon carbide (SiC) alloy, which may bond the silicon ingot to the graphite parts of the crucible or graphite board. By inhibiting or preventing the formation of SiC, the release coating may allow or facilitate the formed silicon ingot to be relatively easily removed from the crucible or graphite board. After formation, the ingot may be cut into individual slices or layers.

In an embodiment, the release coating comprises (a) silicon powder, (b) silicon nitride (Si$_3$N$_4$), and optionally (c) a solvent. In a preferred embodiment, the solvent comprises water, although other suitable solvents may be used, including those, for example, that evaporate prior to contacting molten silicon (e.g., those that evaporate during the annealing process). Other suitable solvents may include organic or inorganic solvents, including, for example, alcohols such as ethanol, propanol, etc. Other additives, furthermore, may be included in the release coating, such as surfactants, etc. In an embodiment, the solvent-to-solids weight ratio is preferably in a range of 3:1 to 10:1, and all subranges therebetween, is more preferably 4:1 to 6:1, and all subranges therebetween, and is most preferably 5:1.

In an embodiment, the release coating comprises 20-99% silicon by weight of the solid components, and all subranges therebetween. In another embodiment, the release coating comprises 30-90% silicon by weight of the solid components, and all subranges therebetween. In yet another embodiment, the release coating comprises 50-85% silicon by weight of the solid components, and all subranges therebetween. In yet another embodiment, the release coating comprises 65-75% silicon by weight of the solid components, and all subranges therebetween.

The silicon may comprise a powder with a particle size distribution $D_{50}$ of less than 50 μm (i.e., 50% of the particles have a diameter less than 50 μm). Larger polycrystalline silicon powder particles—e.g., particles having a mean size larger than 100 μm—may be ground or pulverized to a smaller size. In an embodiment, the silicon may be a byproduct from a silicon grinding operation.

In an embodiment, the release coating comprises 1-80% silicon nitride by weight of the solid components, and all subranges therebetween. In another embodiment, the release coating comprises 10-70% silicon nitride by weight of the solid components, and all subranges therebetween. In yet another embodiment, the release coating comprises 15-50% silicon nitride by weight of the solid components, and all subranges therebetween. In yet another embodiment, the release coating comprises 25-35% silicon nitride by weight of the solid components, and all subranges therebetween.

The silicon nitride may comprise a powder with the tradename SicoNide® made by Vesta Ceramics. A suitable silicon nitride powder may have, for example, a particle size distribution $D_{50}$ of less than 1 μm (i.e., 50% of the particles have a diameter less than 1 μm) and a specific surface area of greater than 6 m$^2$/g.

It is believed that the silicon nitride may promote the conversion of silicon powder to silicon nitride in the presence of nitrogen at high temperatures. Silicon powder may be generally less expensive than silicon nitride powder. In certain embodiments, the mixture of silicon and silicon nitride may include other ingredients, so long as those other ingredients do not substantially inhibit the formation of silicon nitride when annealed in a nitrogen atmosphere (i.e., do not materially affect the properties of the resultant release coating).

It should be noted that all numbers and numerical ranges described and claimed herein are approximate and include some degree of variation.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a release coating comprising the steps of:
    forming a mixture comprising (a) solid components comprising (i) 20-99% silicon by weight and (ii) 1-80% silicon nitride by weight and (b) a solvent;
    applying the mixture to an inner portion of a crucible or graphite board adapted to form an ingot or wafer comprising silicon; and
    annealing the mixture in a nitrogen atmosphere at a temperature ranging from 1000 to 2000° C.

2. The method of claim 1, wherein the mixture has a solvent-to-solids weight ratio of 4:1 to 6:1.

3. The method of claim 2, wherein the solvent comprises water.

4. The method of claim 3, wherein the silicon comprises a powder having a particle size distribution $D_{50}$ of less than 50 μm, and the silicon nitride comprises a powder having a particle size distribution $D_{50}$ of less than 1 μm.

5. The method of claim 2, wherein the solid components comprise (i) 50-85% silicon by weight and (ii) 15-50% silicon nitride by weight.

6. The method of claim 1, wherein the mixture is annealed in a nitrogen atmosphere at a temperature ranging from 1300 to 1500° C.

7. A method of forming an ingot or wafer comprising:

forming a mixture comprising (a) solid components comprising (i) 20-99% silicon by weight and (ii) 1-80% silicon nitride by weight and (b) a solvent;

applying the mixture to an inner portion of a crucible or graphite board adapted to form an ingot or wafer comprising silicon;

annealing the mixture in a nitrogen atmosphere at a temperature ranging from 1000 to 2000° C. to form a treated crucible or graphite board;

pouring silicon into the treated crucible or graphite board;

melting the silicon;

cooling the treated crucible or graphite board until the silicon solidifies to form an ingot or wafer; and removing the ingot or wafer from the treated crucible or graphite board.

8. The method of claim 7, wherein the mixture has a water-to-solids weight ratio of 3:1 to 10:1.

9. The method of claim 7, wherein the solid components comprise (i) 65-75% silicon by weight and (ii) 25-35% silicon nitride by weight.

* * * * *